(12) United States Patent
Hoshikawa et al.

(10) Patent No.: US 7,833,043 B2
(45) Date of Patent: Nov. 16, 2010

(54) SOCKET CONNECTOR

(75) Inventors: Shigeyuki Hoshikawa, Yamato (JP); Atsuhito Noda, Yamato (JP)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 11/989,738

(22) PCT Filed: Aug. 2, 2006

(86) PCT No.: PCT/US2006/030219
§ 371 (c)(1),
(2), (4) Date: Sep. 17, 2009

(87) PCT Pub. No.: WO2007/148493
PCT Pub. Date: Dec. 27, 2007

(65) Prior Publication Data
US 2010/0009563 A1    Jan. 14, 2010

(30) Foreign Application Priority Data
Aug. 2, 2005   (JP) .............................. 2005-223689

(51) Int. Cl.
*H01R 4/50* (2006.01)
(52) U.S. Cl. ..................................... 439/342
(58) Field of Classification Search ................. 439/342, 439/259, 260–266
See application file for complete search history.

(56) References Cited

U.S. PATENT DOCUMENTS 5,730,616 A    3/1998   Nakamura

| | | | | |
|---|---|---|---|---|
| 7,628,635 B2* | 12/2009 | Ma | | 439/342 |
| 7,651,358 B2* | 1/2010 | Liao | | 439/342 |
| 7,658,633 B1* | 2/2010 | Terhune et al. | | 439/331 |
| 7,658,634 B2* | 2/2010 | Ma | | 439/342 |

FOREIGN PATENT DOCUMENTS

| | | |
|---|---|---|
| EP | 0 379 219 A2 | 7/1990 |
| JP | 2002-298998 | 10/2002 |
| JP | 2002-352928 | 12/2002 |
| JP | 2003-123922 | 4/2003 |
| JP | 2003-346999 | 12/2003 |

OTHER PUBLICATIONS

International Search Report for PCT/US2006/030219.

* cited by examiner

*Primary Examiner*—Khiem Nguyen
(74) *Attorney, Agent, or Firm*—Timothy M. Morella

(57) ABSTRACT

A socket connector configured such that elongated guide holes are formed in the housing so as to receive guide members of a device to be connected, and a slide member is attached to the housing to be slidable in the longitudinal direction of the elongated guide holes so as to restrict the guide members to their initial positions. The socket enables direct placement of the device on the housing, can shorten the projection length of projection terminals of the device, can facilitate positioning of the device to thereby enhance the easiness of attachment operation, can prevent bending of the projection terminals, can cope with an increase in density of the projection terminals, and has a simple structure.

13 Claims, 8 Drawing Sheets

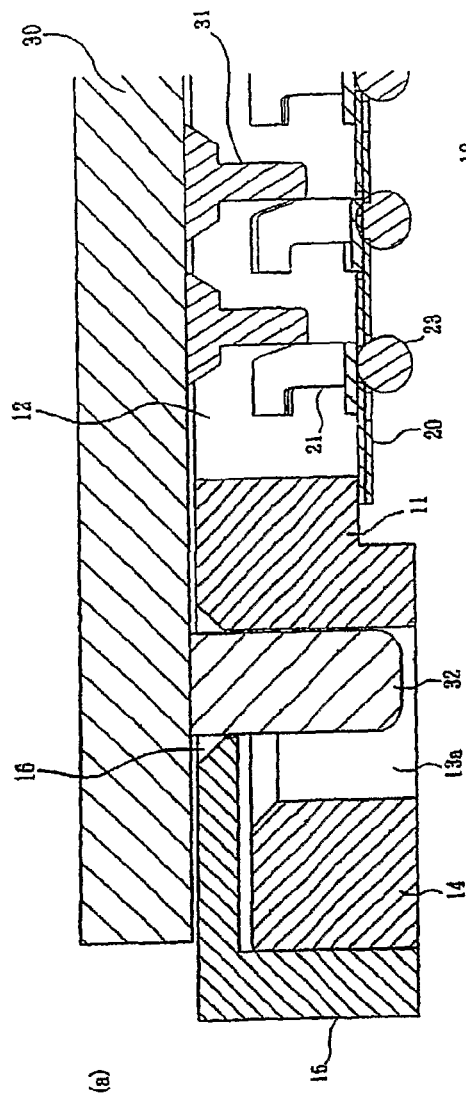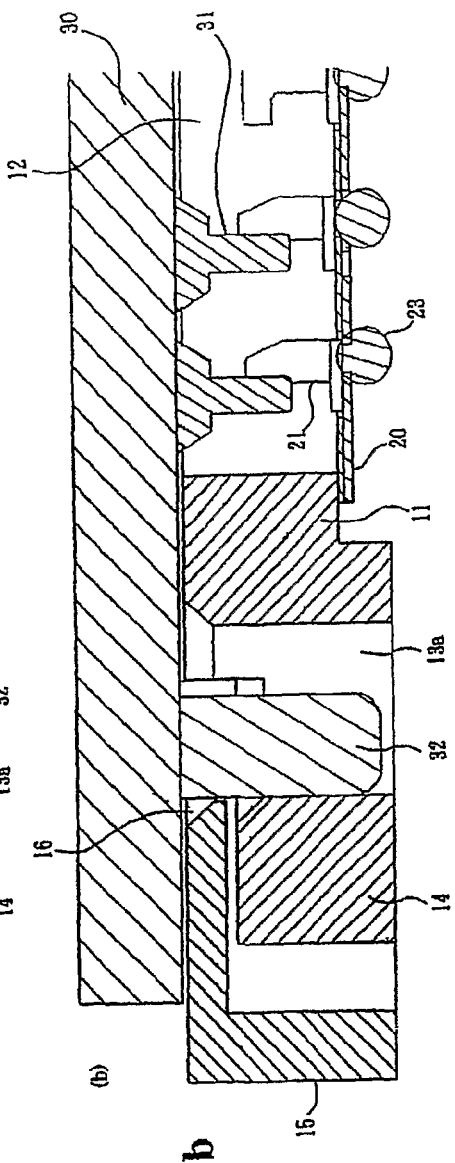
FIGURE 7a
FIGURE 7b

SOCKET CONNECTOR

FIELD OF THE INVENTION

The present invention relates to a socket connector, and more particularly, to a novel socket connector allowing for direct connection of an IC or other connected device to the socket connector.

BACKGROUND OF THE INVENTION

Conventionally, when a semiconductor device, such as an IC or an LSI (Large Scale Integrated Circuit), which has PGA (Pin Grid Array)-type terminals is connected to a circuit board such as a printed wiring board, the terminals are electrically connected to conductive traces on the circuit board via a ZIF (Zero Insertion Force) socket mounted to the circuit board (see, for example, Japanese Patent Application Laid-Open (kokai) No. 2002-352928).

FIG. 8 is a partial sectional view showing a conventional socket. Reference numeral 301 denotes a housing of a socket used for connecting a packaged semiconductor device 310 to a circuit board; more particularly, for electrically connecting pin terminals 311 of the semiconductor device 310 to unillustrated electrodes of the circuit board.

The housing 301 is formed of an insulating material such as resin, and has accommodation holes 302 which are arranged to correspond to the pin terminals 311 and extend through the housing 301 in the thickness direction thereof. Connection terminals 303 to be connected to the pin terminals 311 are disposed in the accommodation holes 302. Solder balls 304 to be connected to the electrodes of the circuit board are bonded to the lower ends of the connection terminals 303. A plate-shaped slide member 305 is disposed on the housing 301 to be slidable in a lateral direction. The slide member 305 is formed of an insulating material such as resin, and has connection holes 307 which are arranged to correspond to the pin terminals 311 and extend through the slide member 305 in the thickness direction thereof.

A rotation support metal member 312 having a cam support hole of radius R1 formed therein is attached to an end of the housing 301. A pressure-receiving metal member 306 having a cam support hole of radius R2 formed therein is attached to an end of the slide member 305. The center axis of the cam support hole of the pressure-receiving metal member 306 deviates in the lateral direction from the center axis of the cam support hole of the rotation support metal member 312 by an amount δ. An eccentric cam 315 is disposed to pass through the cam support hole of the rotation support metal member 312 and the cam support hole of the pressure receiving metal member 306.

When the semiconductor device 310 is to be attached to the socket, first the slide member 305 is set to a ZIF position as shown in FIG. 8. Subsequently, the semiconductor device 310 is placed on the slide member 305, while the pin terminals 311 are inserted into the corresponding connection holes 307. Thus, distal end portions of the pin terminals 311 enter the accommodation holes 302 of the housing 301. At this time, since the slide member 305 is set to the ZIF position, the distal end portions of the pin terminals 311 can enter the accommodation holes 302 with small likelihood of coming into contact with the connection terminals 303 and receiving insertion resistance therefrom.

Subsequently, when an operator turns the eccentric cam 315 through operation of an unillustrated lever, by the action of the eccentric cam 315, the slide member 305 is moved rightward in FIG. 8. As a result, the semiconductor device 310 is also moved rightward in FIG. 8, and the distal end portions of the pin terminals 311 are moved rightward and are connected to the connection terminals 303. In this manner, the pin terminals 311 of the semiconductor device 310 can be electrically connected to the electrodes of the circuit board.

However, in the conventional socket, the pin terminals 311 may be bent at the time of attachment of the semiconductor device 310, for the following reasons. Since the slide member 305 is interposed between the semiconductor device 310 and the housing 301, the length of the pin terminals 311 increases by an amount corresponding to the thickness of the slide member 305, and the position accuracy of the distal end portions of the pin terminals 311 decreases, whereby the distal end portions of the pin terminals 311 become more likely to improperly come into contact with the connection terminals 303 and receive lateral forces therefrom. In addition, because of the increased length, the pin terminals 311 become likely to bend.

Since the slide member 305 is slid by use of the eccentric cam 315, the structure becomes complex, and cost increases. In addition, use of the eccentric cam 315 makes it difficult to cope with increasing density of the pin terminals 311. When the semiconductor device 310 is attached to the socket, all the pin terminals 311 must be inserted into the corresponding connection holes 307. Therefore, positioning of the semiconductor device 310 is difficult, and the easiness of operation of attaching the semiconductor device 310 is spoiled. Moreover, when the semiconductor device 310 is attached to the socket, a check must be made as to whether the slide member 305 is located in the ZIF position. Since such checking is performed on the basis of the position of the lever, the checking operation is difficult to perform. Therefore, the semiconductor device 310 may be placed on the slide member 305, which has not yet been set to the ZIF position, and the pin terminals 311 may improperly come into contact with the connection terminals 303 and bend.

SUMMARY OF THE INVENTION

An object of the present invention is to solve the above-mentioned problems of the conventional socket and to provide a socket which is configured such that elongated guide holes are formed in the housing so as to receive guide members of a device to be connected (hereinafter referred to as a "to-be-connected device"), and a slide member is attached to the housing to be slidable in the longitudinal direction of the elongated guide holes so as to restrict the guide members to their initial positions. The socket of the present invention enables direct placement of the to-be-connected device on the housing, can shorten the projection length of projection terminals of the to-be-connected device, can facilitate positioning of the to-be-connected device to thereby enhance the easiness of attachment operation, can prevent bending of the projection terminals, can cope with an increase in density of the projection terminals, and has a simple structure.

In order to achieve the above object, the present invention provides a socket comprising a plate-shaped housing having a terminal accommodation hole extending through the housing in the thickness direction thereof; and connection terminals attached to the housing and disposed within the terminal accommodation hole. When a to-be-connected device is placed at an initial position, distal end portions of projection terminals disposed on one surface of the to-be-connected device are accommodated in the terminal accommodation hole without receiving resistance from the connection terminals. When the to-be-connected device moves from the initial position to a connection position, the distal end portions of the projection terminals come into engagement with the connection terminals for electrical connection therebetween. The housing includes a placement surface on which the to-be-connected device is placed, at least two elongated guide holes having openings at the placement surface and adapted to receive at least two guide members projecting from one surface of the to-be-connected device, and a slide member attached to be slidable in a longitudinal direction of the elongated guide holes, the slide member being capable of sliding, together with the to-be-connected device, from its initial position to its connection position; and at the initial position, the slide member partially covers the elongated guide holes such that the openings of the elongated guide holes have an initial shape, and the to-be-connected device is placed at the initial position on the placement surface when the guide members are inserted into the elongated guide holes via the openings having the initial shape.

Preferably, the to-be-connected device moves on the placement surface from the initial position to the connection position in the longitudinal direction of the elongated guide holes in a state in which the guide members are inserted into the elongated guide holes.

Preferably, when the to-be-connected device moves on the placement surface from its initial position to its connection position, the slide member is pushed by the guide member and slides from its initial position to its connection position.

Preferably, the housing has a slide guide portion projecting from a body portion of the housing and having an upper surface lower than the placement surface; and the slide member is attached to cover at least the upper surface of the slide guide portion and has an upper surface generally flush with the placement surface.

Preferably, the slide member, at its initial position, comes into contact with the body portion of the housing.

The socket according to the present invention is configured such that elongated guide holes are formed in the housing so as to receive guide members of a to-be-connected device, and a slide member is attached to the housing to be slidable in the longitudinal direction of the elongated guide holes so as to restrict the guide members to their initial positions. Therefore, the socket of the present invention enables direct placement of the to-be-connected device on the housing, can shorten the projection length of projection terminals of the to-be-connected device, can facilitate positioning of the to-be-connected device to thereby enhance the easiness of attachment operation, can prevent bending of the projection terminals, can cope with an increase in density of the projection terminals, and has a simple structure.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which:

FIGS. 7A and 7B are partial sectional views showing the operation of connecting the to-be-connected device to the socket according to the embodiment.

DETAILED DESCRIPTION OF THE DISCLOSED EMBODIMENT

Figure 1:
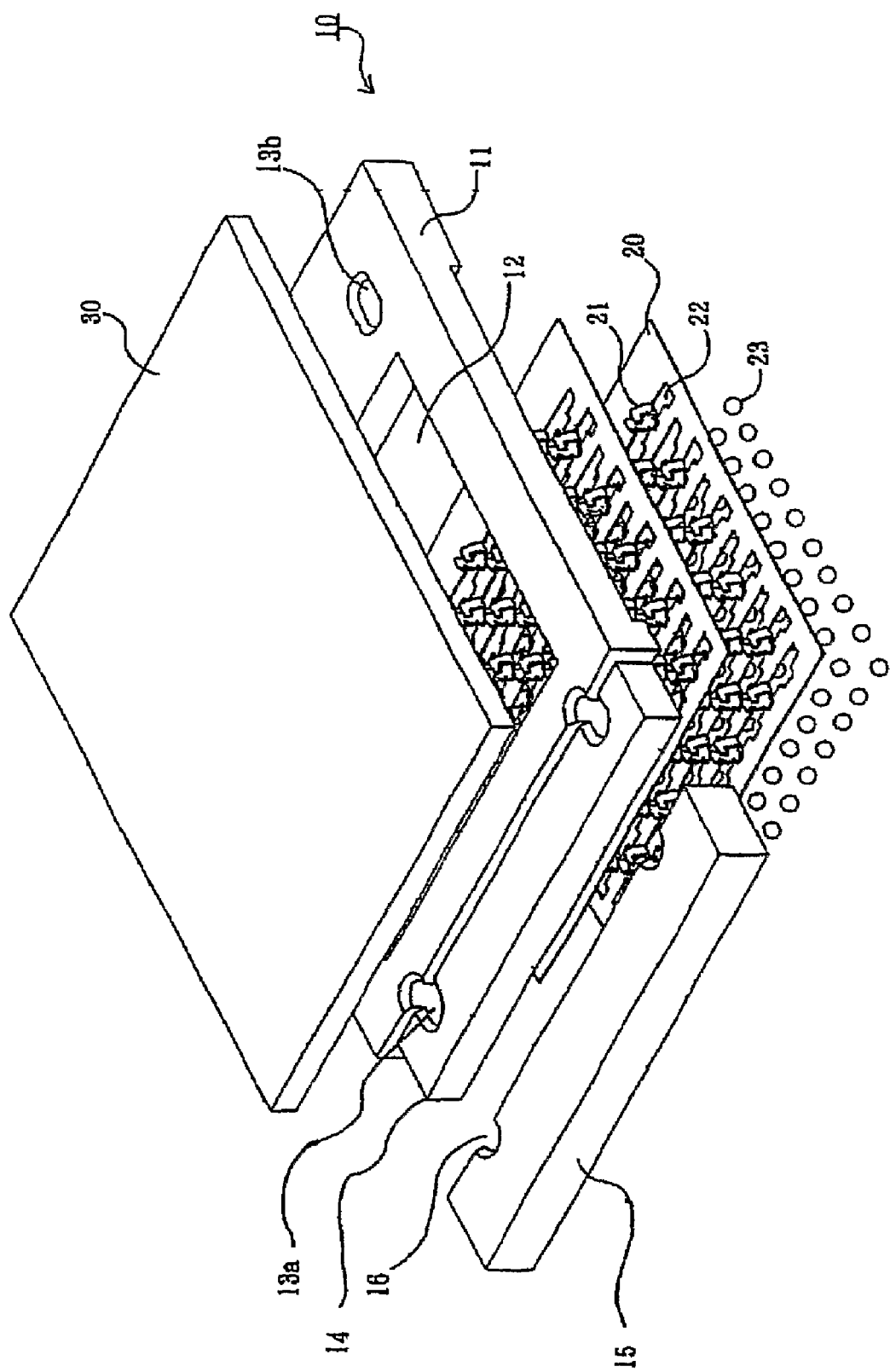
FIG. 1 is an exploded perspective view showing a socket according to an embodiment of the present invention and a to-be-connected device.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated.

Figure 2:
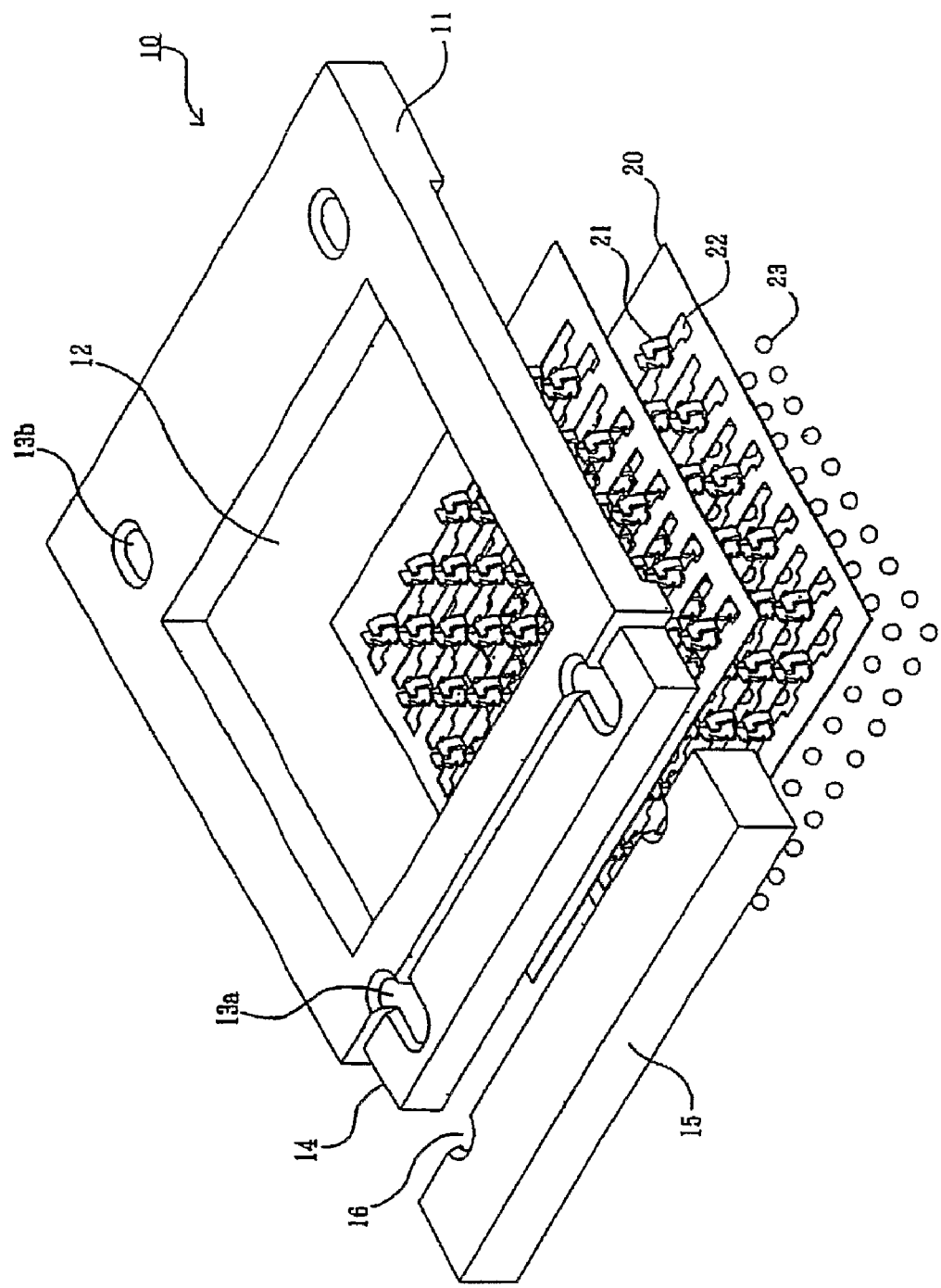
FIG. 2 is an exploded perspective view of the socket according to the embodiment.
Figure 3:
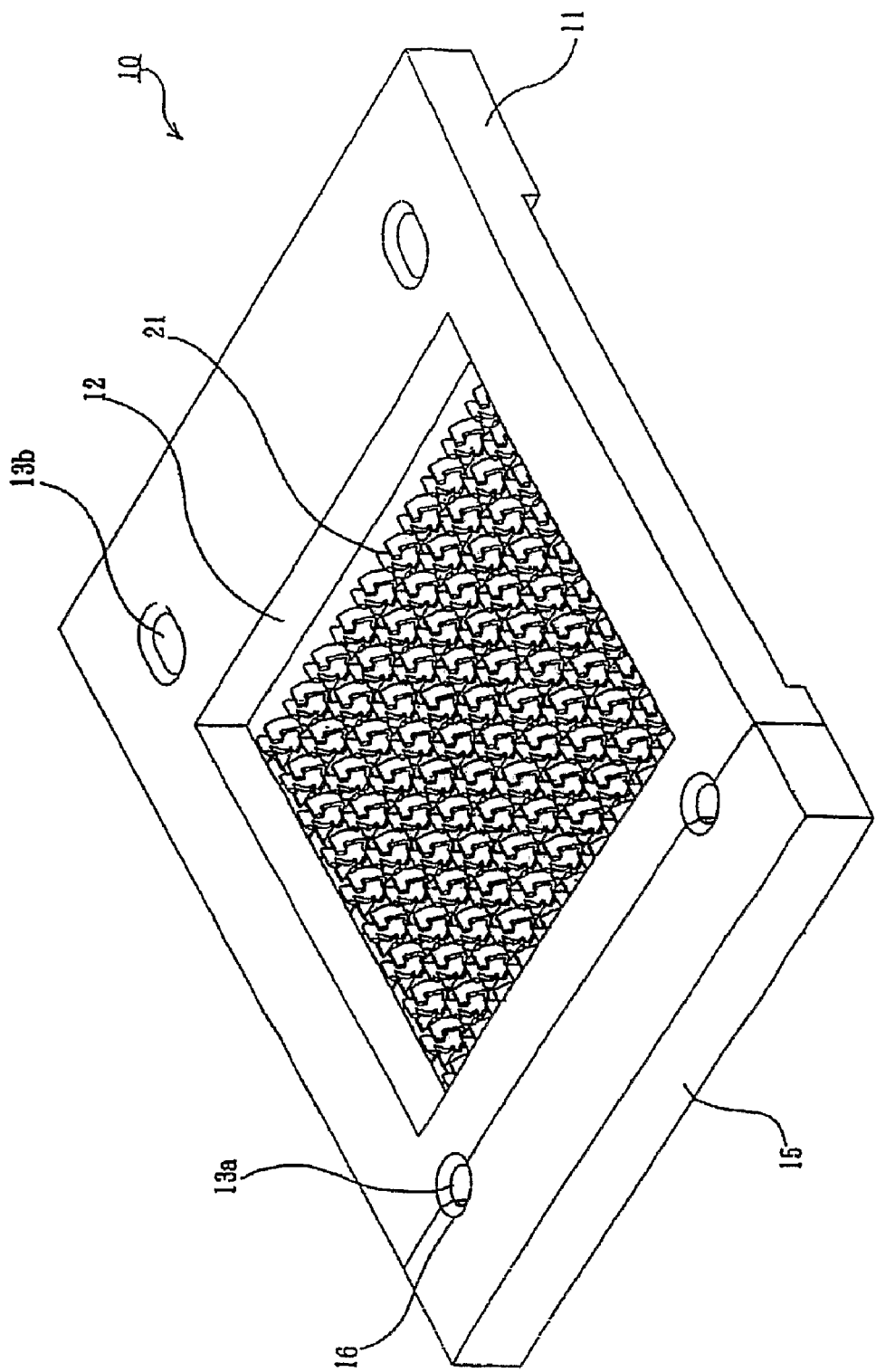
FIG. 3 is a perspective view showing an initial state of the socket according to the embodiment.
Figure 4:
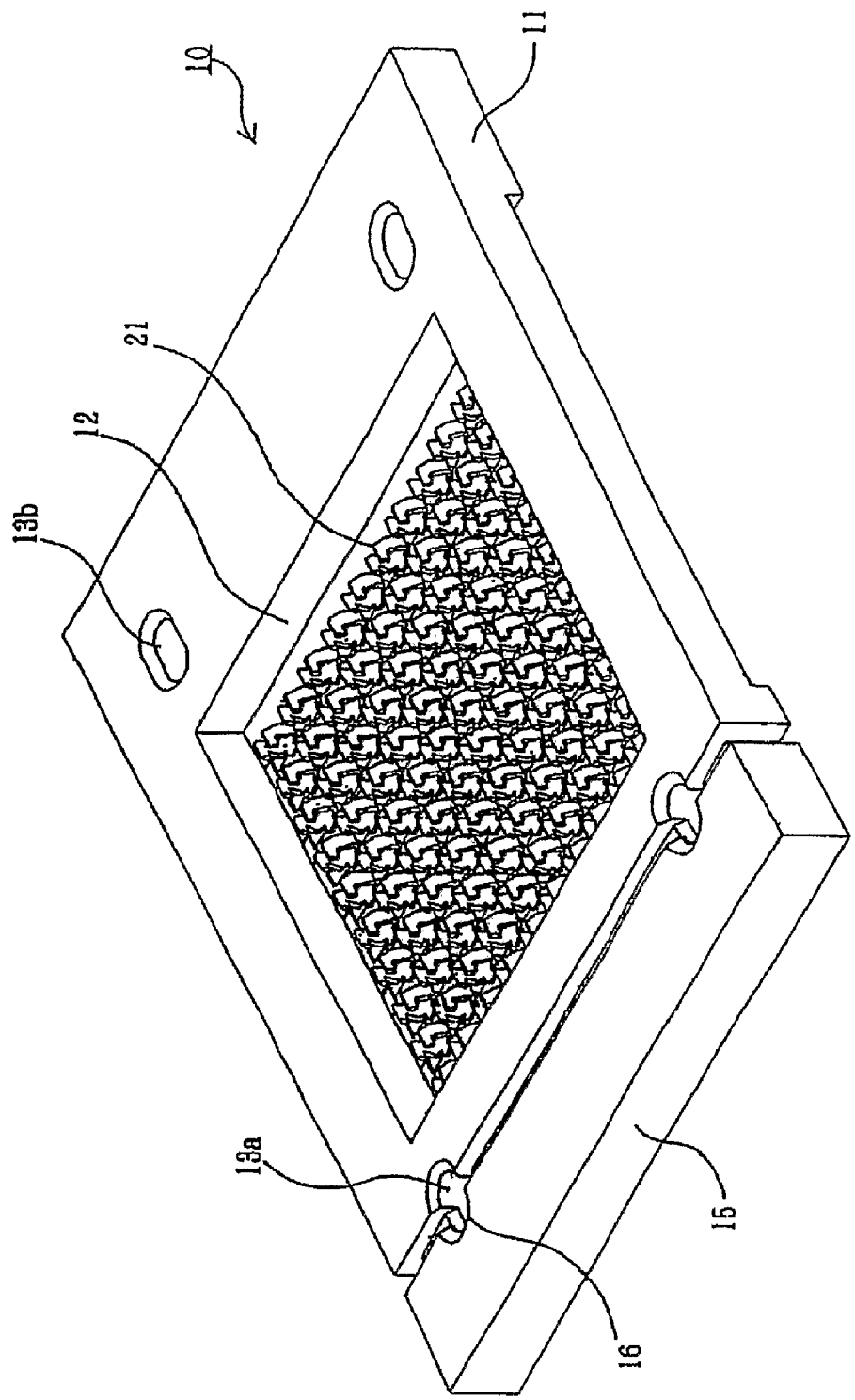
FIG. 4 is a perspective view showing a connected state of the socket according to the embodiment.

FIG. 1 is an exploded perspective view showing a socket according to an embodiment of the present invention and a to-be-connected device; FIG. 2 is an exploded perspective view of the socket according to the embodiment; FIG. 3 is a perspective view showing an initial state of the socket according to the embodiment; and FIG. 4 is a perspective view showing a connected state of the socket according to the embodiment.

In these drawings, reference numeral 10 denotes a socket according to the present embodiment, which includes a generally square or rectangular, plate-shaped housing 11 integrally formed from an insulating material such as synthetic resin. The housing 11 is attached to an unillustrated circuit board such that one surface; i.e., an upper surface in these drawings, faces a surface (lower surface in these drawings) of a to-be-connected device 30 on which projection terminals 31 to be described later are disposed, and the other surface; i.e., a lower surface in these drawings, faces a surface of the circuit board on which unillustrated electrodes (conductive traces) are disposed. The socket 10 is used to establish electrical connection between the projection terminals 31 projecting from the lower surface of the to-be-connected device 30 and the corresponding conductive traces of the circuit board.

The to-be-connected device 30 is a semiconductor device such as an IC or LSI; however, the to-be-connected device 30 may be any type of electrical or electronic device, so long as the device has projection terminals 31 disposed on at least one surface thereof. Further, as will be described later, the projection terminals 31 are bar-shaped or needle-shaped electrode pins, which project vertically from one surface of the to-be-connected device 30, and are arranged in a grid pattern to thereby form a PGA. The circuit board may be of any type. That is, the circuit board may be a testing circuit board of a semiconductor testing apparatus, or a wiring circuit board (e.g., a motherboard or a daughter board) used in electrical or electronic apparatuses such as computers, televisions, game machines, cameras, and navigation apparatuses.

In the description of the present embodiment, terms for expressing direction, such as up, down, left, right, front, and rear, are for explaining the structure and action of portions of the socket 10. However, these terms represent respective directions for the case where the socket 10 is used in an orientation shown in the drawings, and must be construed to represent corresponding different directions when the orientation of the socket 10 is changed.

The housing 11 includes a terminal accommodation hole 12, which is formed at a central portion of the housing 11 and extends through the housing 11 in the thickness direction thereof. The terminal accommodation hole 12 has a generally square or rectangular shape, and has a size approximately corresponding to a region in which the projection terminals 31 are disposed on the to-be-connected device 30. Therefore, when the to-be-connected device 30 is placed on the upper surface of the housing 11, the terminal accommodation hole 12 can accommodate all the projection terminals 31. The upper surface of the housing 11 serves as a placement surface, and the to-be-connected device 30 is directly placed thereon.

Two sheet-shaped terminal support plates 20 are attached to a lower surface of the housing 11. Each of the terminal support plates 20 includes a plurality of connection terminals 21 which are arranged in a grid pattern to be connected with the projection terminals 31. Each of the terminal support plates 20 includes through holes 22 formed on opposite sides of each connection terminal 21. In the illustrated example, two terminal support plates 20 are attached to the lower surface of the housing 11 in a vertically superposed condition.

The connection terminals 21 are arranged in a staggered fashion such that a positional shift of a half pitch is provided between the positions of connection terminals 21 in a certain row and the positions of connection terminals 21 in a row adjacent thereto. Further, a positional shift of a half pitch is provided between the positions of connection terminals 21 in a certain row on the upper terminal support plate 20 and the positions of connection terminals 21 in a corresponding row on the lower terminal support plate 20. Therefore, when the two terminal support plates 20 are vertically superposed together, the connection terminals 21 of the lower terminal support plate 20 pass through the through holes 22 of the upper terminal support plate 20 and project upward from the upper terminal support plate 20, and each of the connection terminals 21 of the lower terminal support plate 20 is located between the corresponding adjacent connection terminals 21 of the upper terminal support plate 20. Thus, the density of the connection terminals 21 becomes double the density in the case where a single terminal support plate 20 is used, and it is possible to cope with the projection terminals 31 of the to-be-connected device 30 which are densely arranged. The number of the terminal support plates 20 is not limited to two, and a single terminal support plate 20 or three or more superposed terminal support plates 20 may be used depending on the required density of the connection terminals 21.

Solder balls 23 are bonded to the lower surface of the lower terminal support plate 20. Specifically, the solder balls 23 are bonded to lower end portions of the connection terminals 21 at the lower surface of the lower terminal support plate 20, and function as terminals, which are electrically connected to the corresponding conductive traces of the circuit board. The solder balls 23 may be omitted. In such a case, the lower end portions of the connection terminals 21 are connected directly to the corresponding conductive traces of the circuit board. In this case, the lower end portions of the connection terminals 21 and the corresponding conductive traces are preferably bonded together by means of an electrically conductive bonding material such as solder. Further, in place of the solder balls 23, terminals of other shapes, such as plate-shaped electrode pads, elongated, plate-shaped leads, or needle-shaped electrode pins, may be connected to the lower end portions of the connection terminals 21.

The housing 11 includes a pair of elongated guide holes 13a and a pair of auxiliary elongated guide holes 13b formed therein and having respective openings at the upper surface (placement surface) of the housing 11. Each of the elongated guide holes 13a and the auxiliary elongated guide holes 13b has an elliptical cross sectional formed by two semicircles and two straight lines connecting the semicircles. The elongated guide holes 13a and the auxiliary elongated guide holes 13b receive cylindrical guide members 32 to be described later, which project perpendicularly from the lower surface of the to-be-connected device 30 in the drawings. The elongated guide holes 13a and the auxiliary elongated guide holes 13b have a function of positioning the to-be-connected device 30 placed on the upper surface of the housing 11. Specifically, when the guide members 32 of the to-be-connected device 30 are inserted into the corresponding guide holes, the to-be-connected device 30 is positioned with respect to the housing 11. For such positioning, the radius of the semicircles at opposite longitudinal ends of each of the elongated guide holes 13a and the auxiliary elongated guide holes 13b is approximately equal to the radius of the guide members 32, and the width of the elongated guide holes 13a and the auxiliary elongated guide holes 13b as measured along the transverse direction is approximately equal to the diameter of the guide members 32. Notably, the auxiliary elongated guide holes 13b may be omitted. In such a case, the to-be-connected device 30 has two guide members 32, which are inserted into the corresponding elongated guide holes 13a.

As shown in FIGS. 1 and 2, a parallelepiped slide guide portion 14 is integrally formed along a side of a body portion of the housing 11 along which the elongated guide holes 13a are provided. The slide guide portion 14 projects in the longitudinal direction of the elongated guide holes 13a, and has an upper surface which is lower than the upper surface of the body portion of the housing 11, and side surfaces which are located inward of the side surfaces of the body portion of the housing 11. The boundary between the body portion of the housing 11 and the slide guide portion 14 extends perpendicular to the longitudinal direction of the elongated guide holes 13a, and crosses both the elongated guide holes 13a. That is, the elongated guide holes 13a are formed to extend from the body portion of the housing 11 and the slide guide portion 14 while crossing the boundary. Semicircular portions of the elongated guide holes 13a near the terminal accommodation hole 12 are formed in the body portion of the housing 11, and the remaining portions of the elongated guide holes 13a are formed in the slide guide portion 14.

A slide member 15 is attached to the slide guide portion 14 to be slidable in the longitudinal direction of the elongated guide holes 13a. The slide member 15 assumes a shape resembling a parallelepiped box, and is attached to cover the circumference of the slide guide portion 14 as shown in FIGS. 3 and 4. In a state in which the slide member 15 is attached to the slide guide portion 14, the upper surface of the slide member 15 becomes approximately flush with the upper surface of the body portion of the housing 11, and the opposite side surfaces of the slide member 15 become approximately flush with the corresponding side surfaces of the body portion of the housing 11.

Further, a pair of semicircular cut portions 16 is formed along a side of the slide member 15 facing the body portion of the housing 11. The semicircular cut portions 16 are disposed such that they are located above the corresponding elongated guide holes 13a when the slide member 15 is attached to the slide guide portion 14.

In the initial state of the socket 10, as shown in FIG. 3, the slide member 15 is in contact with the body portion of the housing 11, and the side thereof along which the cut portions 16 are formed coincides with the boundary between the body portion of the housing 11 and the slide guide portion 14. Therefore, the semicircle portions of the elongated guide holes 13a located near the terminal accommodation hole 12 and formed in the body portion of the housing 11 form circular openings in cooperation with the semicircular cut portions 16 of the slide member 15. In this state, the elongated guide holes 13a formed in the slide guide portion 14, excluding the portions, which overlap the cut portions 16, are covered from above by the slide member 15. By virtue of this configuration, when the to-be-connected device 30 is placed on the upper surface of the housing 11, the guide members 32 of the to-be-connected device 30 are inserted into the circular openings formed by the elongated guide holes 13a and the cut portions 16, so that the guide members 32 are restricted to their initial positions, and positioning of the to-be-connected device 30 to its initial position can be accurately carried out.

When the projection terminals 31 of the to-be-connected device 30 are to be connected to the connection terminals 21, the to-be-connected device 30 having been positioned as described is slid toward the side where the slide member 15 is attached. As a result, the guide members 32 of the to-be-connected device 30 push and slide the slide member 15, whereby, as shown in FIG. 4, the slide member 15 is separated from the body portion of the housing 11, and the openings formed by the elongated guide holes 13a and the cut portions 16 each assume an elliptical shape.

Next, the structure of the terminal support plate 20 including the connection terminals 21 will be described in detail.

Figure 5:
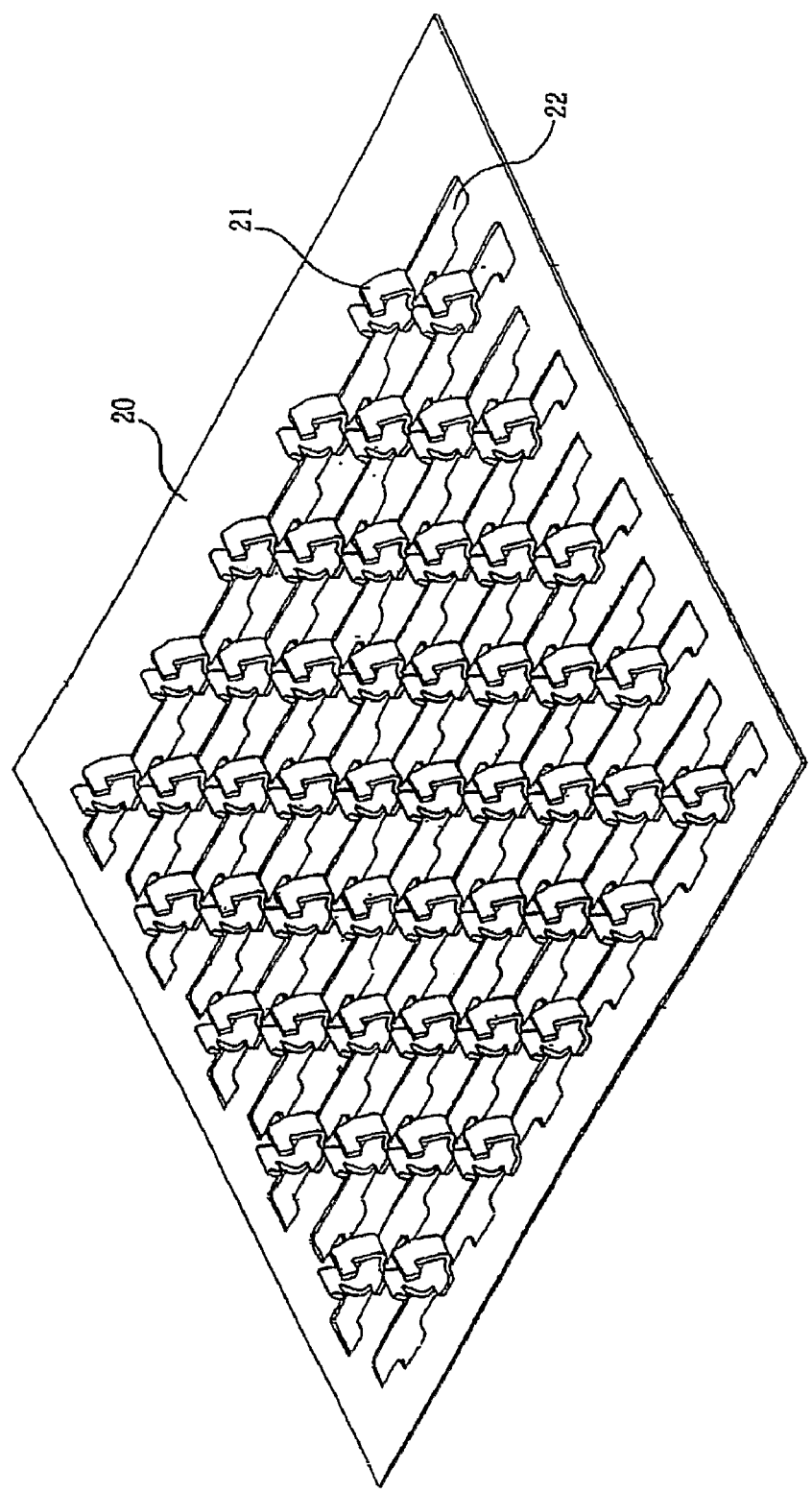
FIG. 5 is a perspective view showing the structure of a terminal support plate having connection terminals used in the socket according to the embodiment.

FIG. 5 is a perspective view showing the structure of a terminal support plate having connection terminals used in the socket according to the embodiment.

For manufacture of the terminal support plate 20 including the connection terminals 21 as shown in FIG. 5, a sheet which is formed of resin such as polyimide and has on one surface thereof a metal layer formed of an electrically conductive material such as copper alloy is first prepared. Subsequently, the metal layer is etched while masks of a terminal shape are used so as to remove the metal layer, except for the portions covered with the masks. In this case, the masks have a shape resembling a bird. As a result, metal layer islands each having a terminal shape resembling a bird remain on the resin sheet. Subsequently, a raising process is performed on the metal layer islands. Specifically, a portion of each metal layer island corresponding to the body of a bird is left as is, and portions of each metal layer island corresponding to the wings of a bird are raised such that distal ends thereof are directed upward. As a result, as shown in FIG. 5, there are formed the connection terminals 21 which are formed of an electrically conductive metal and mounted onto the sheet-shaped terminal support plate 20 formed of an insulating material. Notably, the space between the distal ends of the raised opposite portions of each connection terminal 21 is slightly smaller than the diameter of the projection terminals 31 of the to-be-connected device 30, and is expanded upon insertion of the corresponding projection terminal 31 thereinto.

The through holes 22 are formed on opposite sides of each connection terminal 21. A central portion (i.e., a portion corresponding to a midpoint between adjacent connection terminals 21) of each through hole 22 is expanded to a degree such that a connection terminal 21 provided on the other terminal support plate 20 can be inserted into the expanded portion of the through hole 22. The connection terminals 21 are arranged in a staggered fashion such that a positional shift of a half pitch is provided between the positions of connection terminals 21 in a certain row and the positions of connection terminals 21 in a row adjacent thereto. Further, the through holes 22 are arranged in a staggered fashion such that a positional shift of a half pitch is provided between the positions of the through holes 22 in a certain row and the positions of the through holes 22 in a row adjacent thereto. Therefore, when the above terminal support plate 20 is superposed on a second terminal support plate 20 such that the connection terminals 21 of the second terminal support plate 20 are inserted into the through holes 22, the connection terminals 21 of the two superposed terminal support plates 20 are arranged to form a square grid pattern.

Next, an operation of attaching the to-be-connected device 30 to the socket 10 will be described.

Figure 6A:
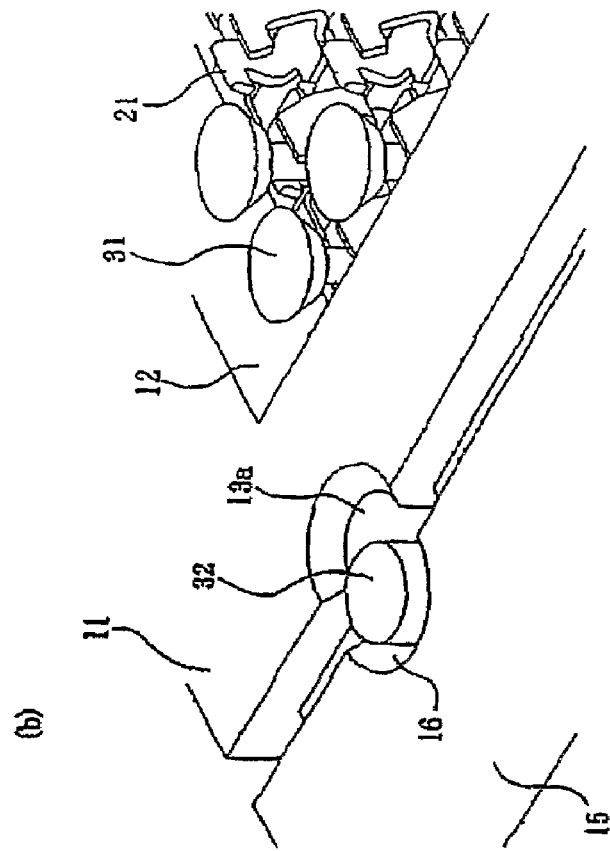
FIGS. 6A and 6B are partial perspective views showing an operation of connecting the to-be-connected device to the socket according to the embodiment.
Figure 6B:
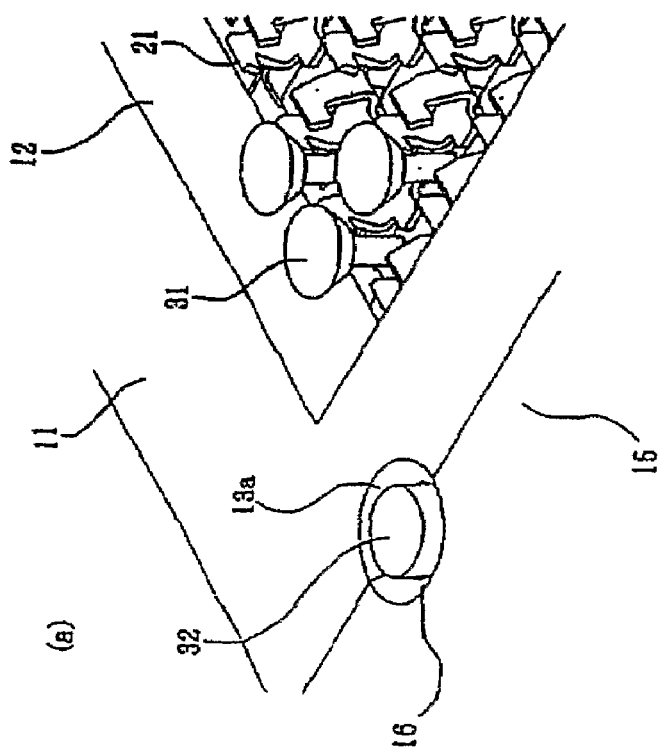
Figure 8:
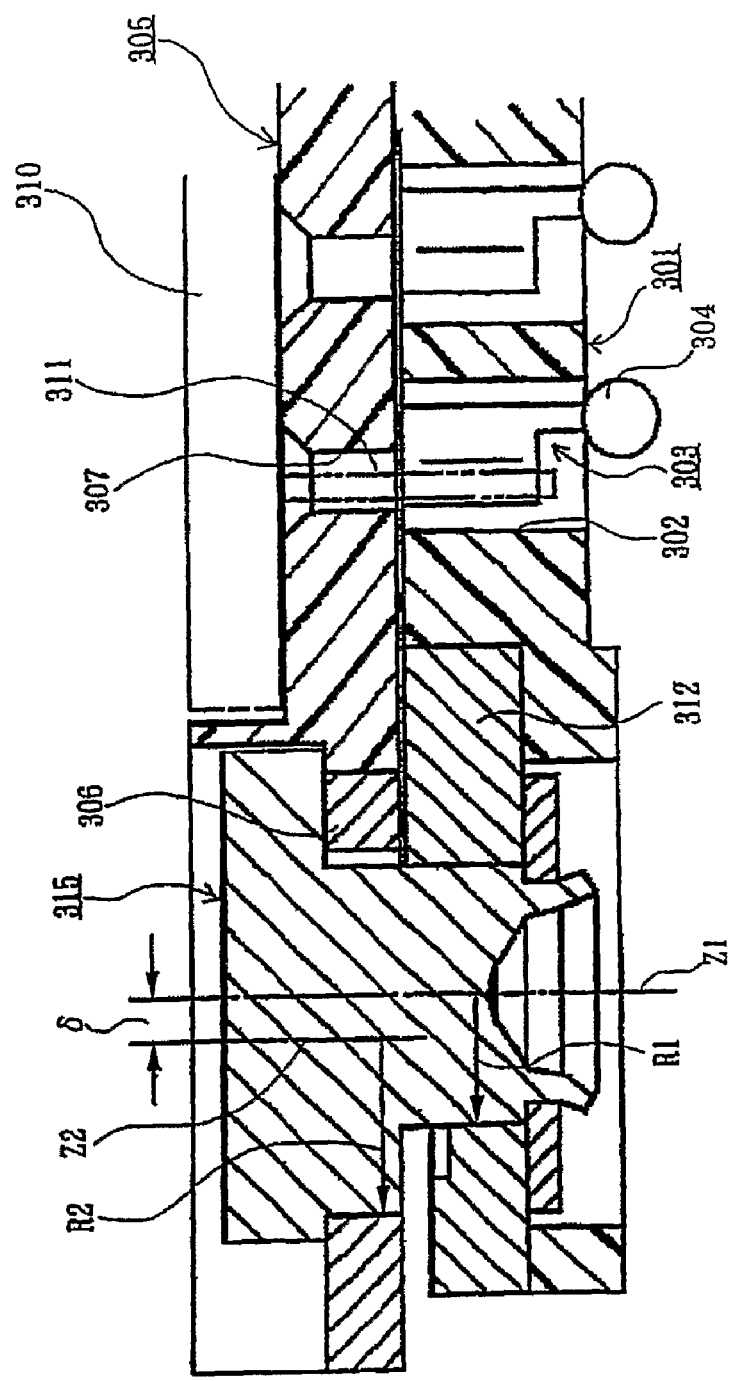
FIG. 8 is a partial perspective view showing a conventional socket.

FIGS. 6A and 6B are partial perspective views showing an operation of connecting the to-be-connected device to the socket according to the embodiment; and FIGS. 7A and 7B are partial sectional views showing the operation of connecting the to-be-connected device to the socket according to the embodiment.

As shown in FIGS. 7A and 7B, the solder balls 23 are bonded to the lower end portions of the connection terminals 21 at the lower surface of the lower terminal support plate 20. The socket 10 is assumed to have previously been mounted onto an unillustrated circuit board by means of connecting the solder balls 23 to connection pads of corresponding conductive traces of the circuit board.

An operator moves, in relation to each other, the to-be-connected device 30 and the circuit board to which the socket 10 is mounted, such that the lower surface of the to-be-connected device 30 faces the upper surface of the housing 11. In this state, the lower surface of the to-be-connected device 30 is generally parallel to the upper surface of the housing 11, and the guide members 32 on the lower surface of the to-be-connected device 30 have been positioned such that their positions coincide with the positions of the elongated guide holes 13a and the auxiliary elongated guide holes 13b of the housing 11. Notably, the number of the guide members 32 is four, and the guide members 32 project downward from the lower surface of the to-be-connected device 30 at positions around the region where the projection terminals 31 are disposed. Further, the socket 10 is in its initial position, and as shown in FIG. 3, the slide member 15 is in its initial position; i.e., in contact with the body portion of the housing 11.

Subsequently, the operator moves at least one of the to-be-connected device 30 and the circuit board toward the other, and inserts the four guide members 32 into the corresponding elongated guide holes 13a and the corresponding auxiliary elongated guide holes 13b, to thereby place the to-be-connected device 30 on the housing 11. At this point in time, the slide member 15 is in its initial position, and partially covers the elongated guide holes 13a, so that the semicircle portions of the elongated guide holes 13a located near the terminal accommodation hole 12 and formed in the body portion of the housing 11 form openings having a circular shape (initial shape), in cooperation with the semicircular cut portions 16 of the slide member 15. Therefore, as shown in FIGS. 6A and 7A, the guide members 32 corresponding to the elongated guide holes 13a are inserted into the elongated guide holes 13a through the circular openings formed by the elongated guide holes 13a and the cut portions 16. Thus, the guide members 32 are restricted to their initial positions, and positioning of the to-be-connected device 30 to its initial position can be accurately carried out. Notably, in FIGS. 6A and 6B, although the guide members 32 and the projection terminals 31 vertically projecting from the lower surface of the to-be-connected device 30 are illustrated, the body portion of the to-be-connected device 30 is not illustrated, so as to facilitate understanding.

In the present embodiment, the upper ends of the circular openings formed by the elongated guide holes 13a and the cut portions 16 are tapered such that the diameter of the openings decreases downward. Therefore, a self-alignment effect is attained when the guide members 32 are inserted into the openings. Further, since the entirety of the to-be-connected device 30 is restricted to its initial position as a result of the guide members 32 being restricted to their initial positions, the distal end portions of the projection terminals 31 enter the terminal accommodation hole 12 while hardly coming into contact with the connection terminals 21 and hardly receiving resistance from the connection terminals 21. Therefore, the initial position of the to-be-connected device 30 can be considered a ZIF position. At this initial position, each projection terminal 31 is located on the rear side (right side in FIGS. 7A and 7B) of the corresponding connection terminal 21 with respect to the slide direction of the slide member 15. Notably, each projection terminal 31 is located at the center of the corresponding connection terminal 21 with respect to the direction perpendicular to the slide direction of the slide member 15 (direction perpendicular to the sheet of FIGS. 7A and 7B), and is located between the distal ends of the opposite raised portions of the connection terminal 21.

Such a positional relation between each projection terminal 31 and the corresponding connection terminal 21 can be obtained through a simple operation of inserting the guide members 32 into the elongated guide holes 13a and the auxiliary elongated guide holes 13b of the socket 10 in the initial state. Therefore, positioning of the to-be-connected device 30 with respect to the socket 10 can be performed easily and accurately. Notably, the auxiliary elongated guide holes 13b may be omitted. In such a case, the number of the guide members 32 becomes two. Further, whether the socket 10 is in the initial state can be readily checked through checking whether the slide member 15 is in its initial position and is in contact with the body portion of the housing 11.

Subsequently, the operator slides the to-be-connected device 30, placed on the upper surface of the housing 11, in relation to the body portion of the housing 11, and moves it to a connection position. In this case, the operator moves the to-be-connected device 30 forward (leftward in FIGS. 7A and 7B) with respect to the slide direction of the slide member 15. At this point in time, since the guide members 32 have been inserted into the elongated guide holes 13a and the auxiliary elongated guide holes 13b, the guide members 32 are movable only in the longitudinal direction of the guide holes 13a and 13b; i.e., in the slide direction of the slide member 15, and are prevented from moving in the transverse direction of the guide holes 13a and 13b; i.e., in the direction perpendicular to the slide direction of the slide member 15. By virtue of this configuration, the to-be-connected device 30 slides forward in the slide direction of the slide member 15 and reaches the connection position without moving in the direction perpendicular to the slide direction of the slide member 15 or changing its posture. When the to-be-connected device 30 moves to the connection position, as shown in FIGS. 6B and 7B, the distal end portion of each projection terminal 31 is inserted into the space between the distal ends of the raised opposite portions of the corresponding connection terminal 21 without fail, and comes into engagement with the connection terminal 21. Thus, as described above, the space between the distal ends of the raised opposite portions of each connection terminal 21 is expanded by the corresponding projection terminal 31, so that the distal ends of the raised opposite portions of the connection terminal 21 are pressed against the projection terminal 31 and electrically connected thereto without fail.

As a result of being pushed by the guide members 32, the slide member 15 slides forward with respect to the slide direction, and moves, together with the to-be-connected device 30, from the initial position to the connection position.

Further, as shown in FIG. 7B, upon contact of the guide members 32 with the forward ends (with respect to the slide direction) of the elongated guide holes 13a and the auxiliary elongated guide holes 13b, sliding movement of the to-be-connected device 30 is stopped. That is, the forward ends of the elongated guide holes 13a and the auxiliary elongated guide holes 13b function as a stopper for stopping the to-be-connected device 30 at the connection position. The sliding distance of the to-be-connected device 30 is defined by the longitudinal length of the elongated guide holes 13a and the auxiliary elongated guide holes 13b. Thus, the to-be-connected device 30 is stopped at the predetermined connection position, and is connected with the socket 10.

When the to-be-connected device 30 is to be removed from the socket 10, the to-be-connected device 30 in the connection position is moved rearward (rightward in FIGS. 7A and 7B) with respect to the slide direction of the slide member 15, in order to perform the above-described operation in reverse.

As described above, in the socket 10 according to the present embodiment, the housing 11 has an upper surface which serves as a placement surface on which the to-be-connected device 30 is placed, at least two elongated guide holes 13a having openings at the upper surface and adapted to receive at least two guide members 32 of the to-be-connected device 30, and a slide member 15 which slides, together with the to-be-connected device 30, from the initial position to the connection position. At the initial position, the slide member 15 partially covers the elongated guide holes 13a such that the openings of the elongated guide holes 13a have a circular shape (initial shape), and the to-be-connected device 30 is placed at the initial position on the upper surface when the guide members 32 are inserted into the elongated guide holes 13a via the circular openings.

Since the to-be-connected device 30 can be placed directly on the housing 11, rather than on a slide member 305 as in the prior art, the projection length of the projection terminals 31 of the to-be-connected device 30 can be shortened, and bending of the projection terminals 31 can be prevented. Further, since the positional accuracy of the distal end portions of the projection terminals 31 is improved, engagement of the projection terminals 31 with the connection terminals 21 becomes reliable, and since the resistance which the projection terminals 31 receive from the connection terminals 21 decreases, the possibility of the projection terminals 31 bending decreases further. Moreover, since positioning of the to-be-connected device 30 to the initial position is easy, easiness of the mounting operation is enhanced.

Since an intermediate member, such as the slide member 305 described in the "Description of the Related Art" section, becomes unnecessary, the arrangement pitch of the connection terminals 21 can be reduced so as to increase the density of the connection terminals 21. Further, since an intermediate member becomes unnecessary, the structure of the socket 10 can be simplified, accurate machining can be performed on the socket 10, manufacture of the socket 10 is facilitated, and cost can be reduced.

The to-be-connected device 30 moves on the upper surface of the housing 11 from the initial position to the connection position in the longitudinal direction of the elongated guide holes 13a in a state in which the guide members 32 are inserted into the elongated guide holes 13a. Therefore, handling of the to-be-connected device 30 is easy, and easiness of the mounting operation is enhanced. Further, through a simple operation of moving the to-be-connected device 30 in a single direction, the distal end portions of the projection terminals 31 can be brought into engagement with the connection terminals 21 for electrical connection.

In the initial position, since the slide member 15 is in contact with the body portion of the housing 11, whether the socket 10 is in the initial state can be easily checked. Therefore, the to-be-connected device 30 is prevented from being placed on the socket 10, which is not in the initial state, and the distal end portions of the projection terminals 31 are prevented from improperly coming into contact with the connection terminals 21 and bending.

While a preferred embodiment of the invention is shown and described, it is envisioned that those skilled in the art may devise various modifications without departing from the spirit and scope of the foregoing description and the appended claims.

What is claimed is:

1. A socket comprising:
a housing having a terminal accommodation hole extending through the housing in the thickness direction thereof; and
connection terminals attached to the housing and disposed within the terminal accommodation hole, wherein
when a to-be-connected device is placed at an initial position, distal end portions of projection terminals disposed on one surface of the to-be-connected device are accommodated in the terminal accommodation hole without receiving resistance from the connection terminals; and
when the to-be-connected device moves from the initial position to a connection position, the distal end portions of the projection terminals come into engagement with the connection terminals for electrical connection therebetween, wherein
the housing includes a placement surface on which the to-be-connected device is placed, at least one elongated guide hole having openings at the placement surface and adapted to receive a guide member projecting from one surface of the to-be-connected device, and a slide member attached to be slidable in a longitudinal direction of the elongated guide hole, the slide member being capable of sliding, together with the to-be-connected device, from its initial position to its connection position; and
at the initial position, the slide member partially covers the elongated guide hole such that the openings of the elongated guide hole have an initial shape, and the to-be-connected device is placed at the initial position on the placement surface when the guide member is inserted into the elongated guide hole via the opening having the initial shape.

2. A socket according to claim 1, wherein the to-be-connected device moves on the placement surface from the initial position to the connection position in the longitudinal direction of the elongated guide hole in a state in which the guide member is inserted into the elongated guide hole.

3. A socket according to claim 1, wherein when the to-be-connected device moves on the placement surface from its initial position to its connection position, the slide member is pushed by the guide member and slides from its initial position to its connection position.

4. A socket according to claim 1, wherein the housing has a slide guide portion projecting from a body portion of the housing and having an upper surface lower than the placement surface and the slide member is attached to cover at least the upper surface of the slide guide portion and has an upper surface generally flush with the placement surface.

5. A socket according to claim 1, wherein the slide member, at its initial position, comes into contact with the body portion of the housing.

6. A socket according to claim 1, wherein the housing is plate shaped.

7. A socket according to claim 1, including at least one auxiliary elongated guide hole.

8. A socket according to claim 1, wherein the elongated guide hole is located between the slide member and the auxiliary elongated guide hole.

9. A socket according to claim 1, including a plurality of elongated guide holes and a plurality of guide members.

10. A socket according to claim 1, wherein a portion of the elongated guide hole is located on the housing and a portion of the elongated guide hole is located on the slide member.

11. A socket according to claim 7, including a plurality of auxiliary elongated guide holes and a plurality of guide members.

12. A socket according to claim 1, wherein the connection terminals are formed from a single sheet of material.

13. A socket according to claim 1, wherein the connection terminals are formed from a plurality of sheets of material.

* * * * *